(12) United States Patent
Uchiyama et al.

(10) Patent No.: US 10,599,266 B2
(45) Date of Patent: Mar. 24, 2020

(54) TOUCH PANEL INSPECTION DEVICE AND INSPECTION METHOD FOR TOUCH PANEL

(71) Applicant: FANUC CORPORATION, Yamanashi (JP)

(72) Inventors: Tatsuhiro Uchiyama, Yamanashi-ken (JP); Junpei Maruyama, Yamanashi-ken (JP); Akimasa Matsuo, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/059,563

(22) Filed: Aug. 9, 2018

(65) Prior Publication Data
US 2019/0056827 A1 Feb. 21, 2019

(30) Foreign Application Priority Data
Aug. 15, 2017 (JP) .................. 2017-156902

(51) Int. Cl.
*G06F 3/041* (2006.01)
*G01R 27/02* (2006.01)
*G06F 3/045* (2006.01)

(52) U.S. Cl.
CPC ........... *G06F 3/0418* (2013.01); *G01R 27/02* (2013.01); *G06F 3/045* (2013.01); *G06F 3/0412* (2013.01); *G06F 2203/04103* (2013.01)

(58) Field of Classification Search
None
See application file for complete search history.

(56) References Cited

U.S. PATENT DOCUMENTS

| 9,524,071 B2 * | 12/2016 | Auer ................. G06Q 10/10 |
| 2004/0027397 A1 * | 2/2004 | Sato ................. G06F 3/0421 |
| | | 715/863 |

(Continued)

FOREIGN PATENT DOCUMENTS

| CN | 105486687 A1 | 4/2016 |
| JP | H01125615 A | 5/1989 |

(Continued)

OTHER PUBLICATIONS

Decision to Grant a Patent issued by the Japanese Patent Office in relation to Japanese Application No. 2017-156902 dated Jun. 11, 2019 (3 pages) along with English language translation (2 pages).

(Continued)

*Primary Examiner* — Amr A Awad
*Assistant Examiner* — Maheen I Javed
(74) *Attorney, Agent, or Firm* — Robert P. Michal, Esq.; Carter, DeLuca & Farrell LLP

(57) ABSTRACT

An inspection device for a touch panel inspects the touch panel which is provided in a display unit. The inspection device is equipped with an operation position display control unit configured to display on the display unit an operation position that is touched by a user, a detection unit configured to detect a detection position depending on a touch operation made by the user with respect to the touch panel, and a positional relationship display control unit configured to display on the display unit positional relationship information indicating a positional relationship between the operation position and the detection position.

19 Claims, 8 Drawing Sheets

(56) References Cited

U.S. PATENT DOCUMENTS

| | | | | |
|---|---|---|---|---|
| 2016/0154474 A1* | 6/2016 | Park | .................... | G06F 3/03545 |
| | | | | 345/173 |
| 2017/0090749 A1* | 3/2017 | Marsden | ............. | G06F 3/04886 |
| 2018/0113562 A1* | 4/2018 | Ito | ......................... | G06F 3/0416 |
| 2018/0150183 A1* | 5/2018 | Putra | .................... | G06F 3/0418 |

FOREIGN PATENT DOCUMENTS

| | | | |
|---|---|---|---|
| JP | H08171451 | A | 7/1996 |
| JP | 2000305714 | A | 11/2000 |
| JP | 2009-140351 | A | 6/2009 |
| JP | 2010250695 | A | 11/2010 |
| JP | 2011013872 | A | 1/2011 |
| JP | 2011054154 | A | 3/2011 |
| JP | 2012234476 | A | 11/2012 |
| JP | 2016045611 | A | 4/2016 |
| WO | 2008108275 | A1 | 9/2008 |

OTHER PUBLICATIONS

Written Opinion issued by the Japanese Patent Office in relation to Japanese Application No. 2017-156902 dated May 17, 2019 (1 page) along with English language translation (2 pages).
Notice of Reasons for Refusal issued by the Japanese Patent Office in relation to Japanese Application No. 2017-156902 dated Apr. 16, 2019 (3 pages) along with English language translation (4 pages).

\* cited by examiner

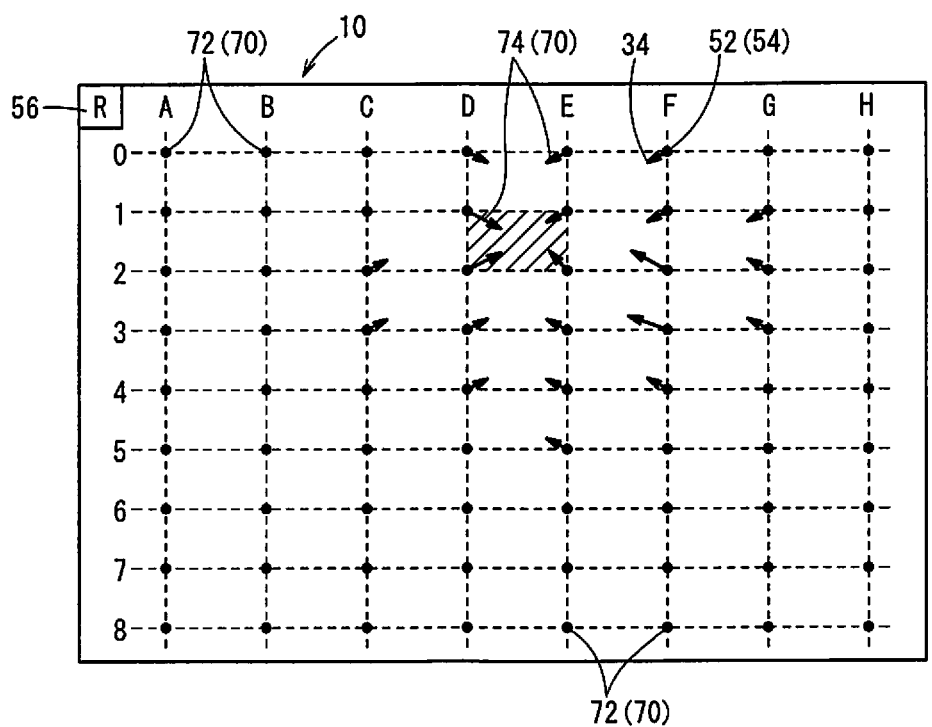

FIG. 6

| INSPECTION TIME | | A | B | C | ... | H |
|---|---|---|---|---|---|---|
| 2017/1/23 12:34 | 0 | (10, 10) | (20, 10) | (30, 10) | ... | (80, 10) |
| | 1 | (10, 20) | (20, 20) | (30, 20) | ... | (80, 20) |
| | ... | ... | ... | ... | ... | ... |
| | 8 | (10, 80) | (20, 80) | (30, 80) | ... | (80, 80) |
| 2017/2/10 9:15 | 0 | (10, 10) | (20, 10) | (30, 10) | ... | (80, 10) |
| | 1 | (10, 20) | (20, 20) | (30, 20) | ... | (80, 20) |
| | ... | ... | ... | ... | ... | ... |
| | 8 | (10, 80) | (20, 80) | (30, 80) | ... | (80, 80) |
| 2017/3/15 17:10 | 0 | (10, 10) | (20, 10) | (30, 10) | ... | (80, 10) |
| | 1 | (10, 20) | (20, 20) | (30, 20) | ... | (80, 20) |
| | ... | ... | ... | ... | ... | ... |
| | 8 | (10, 80) | (20, 80) | (30, 80) | ... | (80, 80) |

60

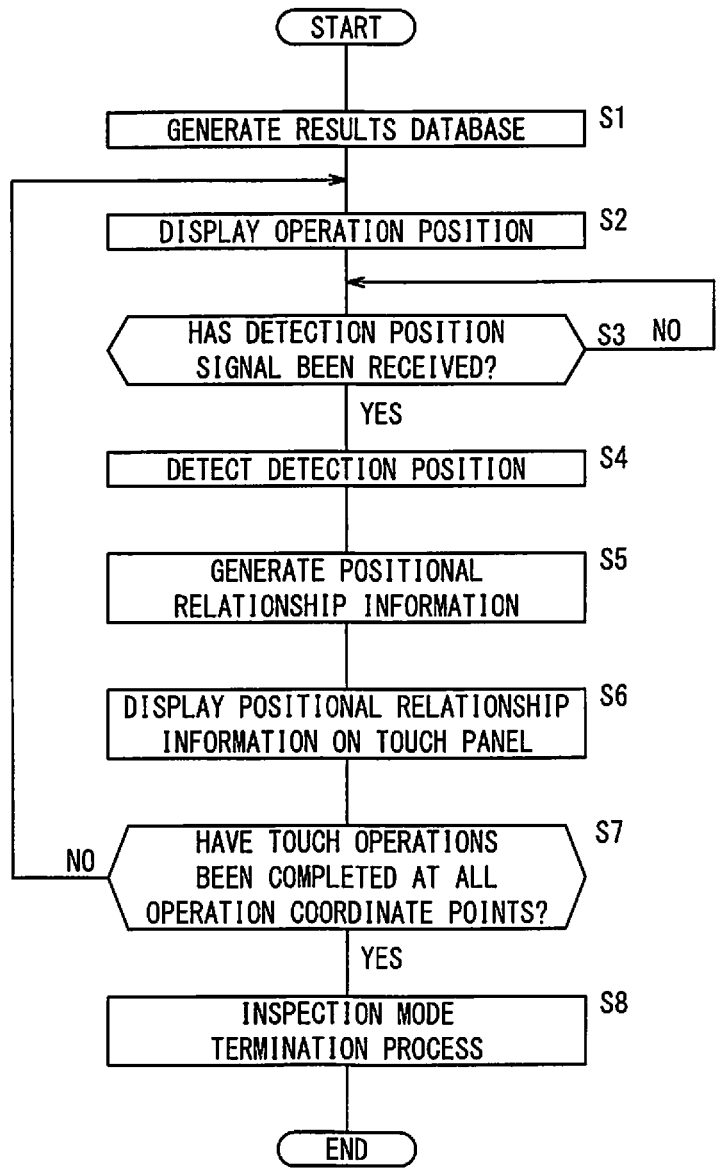

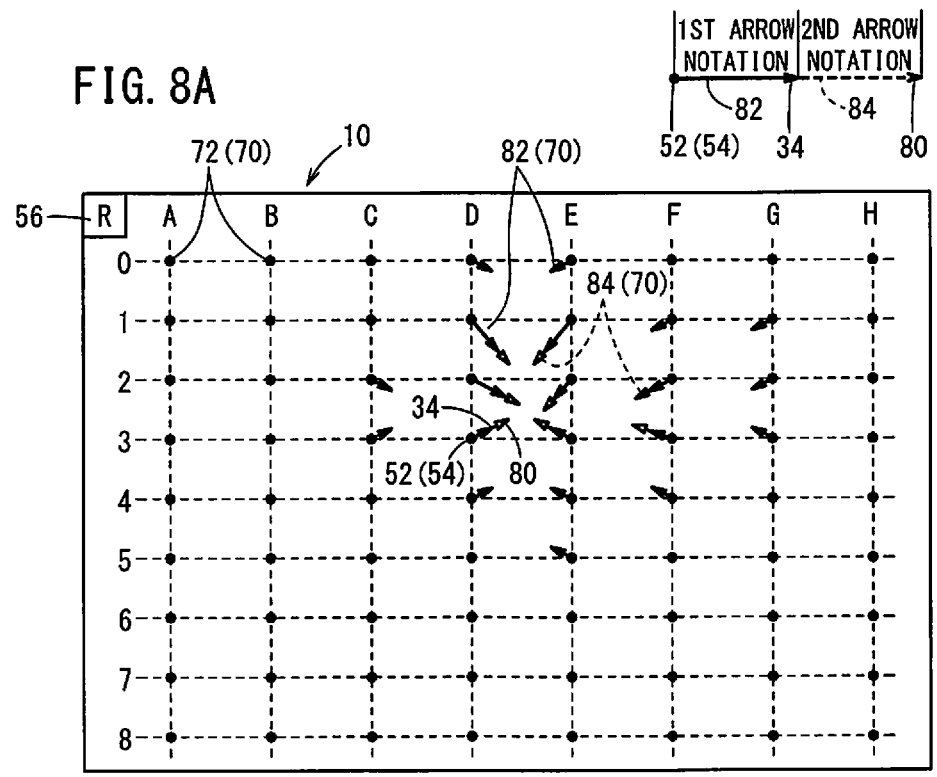
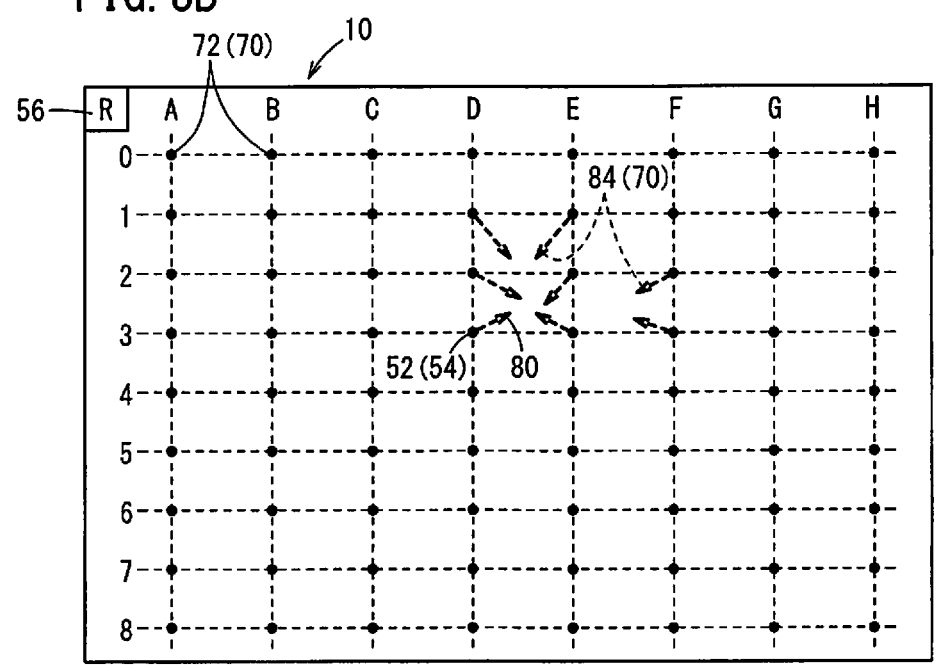

TOUCH PANEL INSPECTION DEVICE AND INSPECTION METHOD FOR TOUCH PANEL

CROSS-REFERENCE TO RELATED APPLICATION

This application is based upon and claims the benefit of priority from Japanese Patent Application No. 2017-156902 filed on Aug. 15, 2017, the contents of which are incorporated herein by reference.

BACKGROUND OF THE INVENTION

Field of the Invention

The present invention relates to a touch panel inspection device configured to inspect a touch panel for an abnormality caused by foreign material, as well as to an inspection method for a touch panel.

Description of the Related Art

In industrial machines and machine tools installed in factories, it is often the case that touch panels are applied thereto as operation screens in order to enhance operability. However, in factories, foreign material such as dust, powder, and chips of plastic or metal are floating in the environment, and there is a possibility that such foreign material may slip in between the touch panel and a protective sheet that covers the touch panel. In particular, it is often the case that foreign material of this type is fine, and is difficult to discover by way of visual inspection. In addition, if such foreign material becomes sandwiched between the touch panel and the protective sheet, touch operations by the user are erroneously detected.

In order to deal with entry of such foreign material, for example, in the input device disclosed in Japanese Laid-Open Patent Publication No. 2009-140351, the position of the foreign material is detected based on an assumption that the foreign material, which has entered into the touch panel, presses against the touch panel at all times. Further, from the position of the detected foreign material, and an actual detection position of the touch panel, the input device corrects or compensates the position to which a touch operation of a user was actually applied.

SUMMARY OF THE INVENTION

Incidentally, in the case that foreign material becomes caught between the touch panel and the protective sheet, it is not necessarily the case that the touch panel is pressed by the foreign material at all times. For example, an erroneous detection may occur due to the influence of foreign material that has entered into the touch panel, only when a touch operation is made in the vicinity of such foreign material.

The present invention has been devised in order to solve the aforementioned problem, and has the object of providing a touch panel inspection device, as well as a method of inspecting a touch panel, in which it is possible to easily inspect a detection position of the touch panel, and to recognize an abnormal state due to the presence of foreign material.

A first aspect of the present invention is characterized by a touch panel inspection device configured to inspect a touch panel that is provided on a display unit, including an operation position display control unit configured to display on the display unit an operation position that is touched by a user, a detection unit configured to detect a touch position depending on a touch operation of the user based on an output signal of the touch panel, and a positional relationship display control unit configured to display on the display unit positional relationship information indicating a positional relationship between the operation position and a detection position based on the touch position detected by the detection unit.

A second aspect of the present invention is characterized by a touch panel inspection method for inspecting a touch panel that is provided on a display unit, including an operation position display step of displaying on the display unit an operation position that is touched by a user, a detection step of detecting a touch position depending on a touch operation of the user based on an output signal of the touch panel, and a positional relationship displaying step of displaying on the display unit positional relationship information indicating a positional relationship between the operation position and a detection position based on the touch position detected in the detection step.

According to the present invention, in the touch panel inspection device and the touch panel inspection method, it is possible to easily inspect the detection position of the touch panel, and to provide information to the user concerning a deviation of the detection position, thereby making it possible to recognize an abnormal state due to foreign material. More specifically, based on the displayed positional relationship information, the user becomes capable of suitably grasping a coincidence or non-coincidence between the touch position based on the operation position, and the detection position detected by the touch panel. Consequently, the user can appropriately determine whether to continue using the touch panel or the protective sheet covering the touch panel, or to seek repair or replacement thereof.

The above and other objects, features, and advantages of the present invention will become more apparent from the following description when taken in conjunction with the accompanying drawings, in which a preferred embodiment of the present invention is shown by way of illustrative example.

BRIEF DESCRIPTION OF THE DRAWINGS

FIG. 5 is a plan view illustrating a display of the touch panel when the touch operation is completed;

FIG. 6 is a table showing an example of a results database;

FIG. 7 is a flowchart showing a process flow of the inspection device;

FIG. 8A is a plan view illustrating a display of a touch panel according to a modification; and FIG. 8B is a plan view illustrating a display of a touch panel according to another modification.

DESCRIPTION OF THE PREFERRED EMBODIMENTS

A preferred embodiment of the present invention will be presented and described in detail below with reference to the accompanying drawings.

Figure 1:
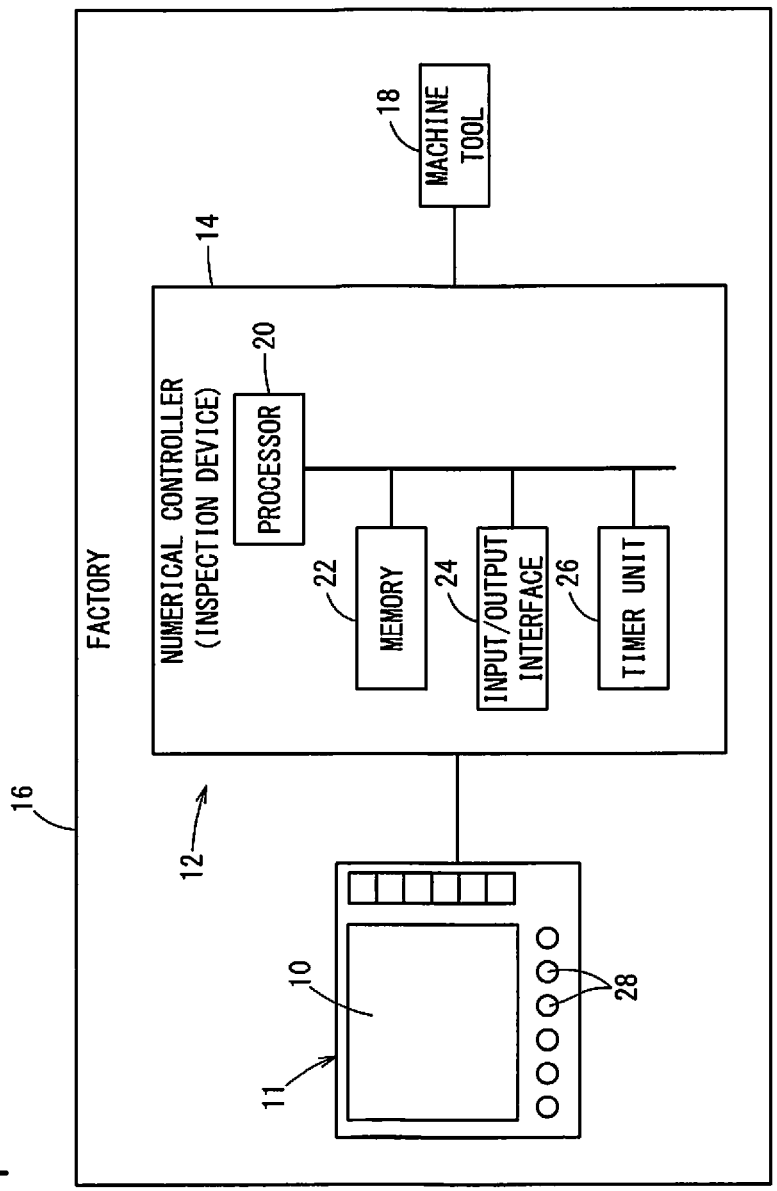
FIG. 1 is an explanatory view showing an overall configuration of a touch panel inspection device according to an embodiment of the present invention.

An inspection device 12 for a touch panel 10 according to an embodiment of the present invention is installed together as one functional unit of a numerical controller 14, and as shown in FIG. 1, has a function of inspecting the touch panel 10 which is provided on a display unit 11. For example, the numerical controller 14 is provided on a machine tool 18 that is installed in a factory 16 or the like. The display unit 11 displays necessary information under a display command of the numerical controller 14, and transmits, to the numerical controller 14, information (input information) of a touch operation made on the touch panel 10 by a user such as an operator or the like.

The numerical controller 14 carries out information processing to control the machine tool 18, on the basis of displayed content (including displayed positions) of the display unit 11, and the position information at the time of a touch operation. The numerical controller 14 is configured in the form of a computer having a processor 20, a memory 22 (storage unit), an input/output interface 24, a timer unit 26, and the like, and is connected through the input/output interface 24 to the display unit 11, the machine tool 18, and the like.

The machine tool 18 to which the numerical controller 14 is connected includes axes (for example, three mutually orthogonal linear motion axes, and a spindle that rotates a tool about an axis) such as a linear motion axis and a turning axis (neither of which is shown), etc. The machine tool 18 drives the axes based on respective drive commands received from the numerical controller 14, to thereby carry out an axial feed of a tool or an object to be machined, rotation of the tool, etc., and appropriately machine the object to be machined with the tool.

In addition, during execution of an inspection mode in accordance with an instruction of the user, the numerical controller 14 operates as the inspection device 12 to carry out an inspection of the touch panel 10 of the display unit 11. Moreover, the inspection device 12 may be configured as a separate device that is separated from the numerical controller 14. For example, the inspection device 12 in the form of a separate device is electrically connected to the display unit 11, and carries out an inspection of the touch panel 10 at a time that periodic maintenance is performed on the machine tool 18 or the like. Further, the inspection device 12 may be disposed in a display control unit (not shown) of the touch panel 10 which is incorporated in the display unit 11 itself. Further, the inspection device 12 is not limited to being applied to the display unit 11 of the numerical controller 14, but can be applied to a display unit 11 that is portable or capable of being installed in various locations (for example, a monitor of a controller of an industrial machine or a robot, a monitor that is connected to another computer, or a mobile information processing device).

The display unit 11 is configured as an information input/output device of a computer, which outputs image information via the touch panel 10, and automatically transmits input information to the numerical controller 14 by a touch operation of the user being input thereto. Moreover, the display unit 11 may have physical buttons 28 or the like serving as other input means for the touch panel 10.

The touch panel 10 employs a resistive film system. In this case, in the touch panel 10, two non-illustrated transparent resistive films are separated by a predetermined distance and arranged in facing relation to each other, and a voltage is applied to one of the transparent resistive films. In addition, at a touch position of the user, the voltage is applied from the one transparent resistive film to the other transparent resistive film, whereby the touch position is detected. For example, on the transparent resistive films, a plurality of electrodes are wired in two-dimensional directions (an X direction and a Y direction) that are mutually orthogonal to each other on the touch panel 10, and a voltage signal indicative of the X direction position, and a voltage signal indicative of the Y direction position are output from the electrodes to the numerical controller 14.

Figure 2A:
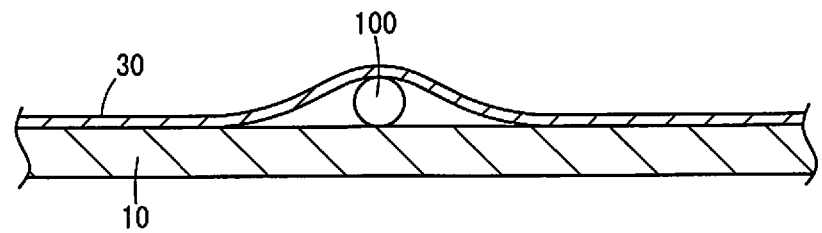
FIG. 2A is a side cross-sectional view showing a state in which foreign material is caught between the touch panel and a protective sheet.

Further, as shown in FIG. 2A, on the surface of the touch panel 10 according to the present embodiment, a protective sheet 30 (film) is provided for preventing formation of scratches and entry of dust. However, inside the factory 16, foreign material 100 such as dust, powder, and chips of plastic or metal are floating in the environment, and cases also occur in which such foreign material 100 may become caught and sandwiched between the touch panel 10 and the protective sheet 30. When the foreign material 100 is caught in this manner, it becomes difficult for the touch panel 10 to accurately detect the touch position of the user.

Below, with reference to FIGS. 2A through 2D, a detailed description will be given concerning principles by which a detection error is generated at the touch position of the user, in the case that foreign material 100 is sandwiched between the touch panel 10 and the protective sheet 30.

In the case that the foreign material 100, which is sandwiched between the touch panel 10 and the protective sheet 30, presses against the touch panel 10 at all times, the position of the foreign material 100 is easily ascertained, and therefore, various countermeasures can be taken such as correcting or compensating the detection position or the like. On the other hand, as shown in FIG. 2A, in certain cases, the foreign material 100 may be placed in a state of being sandwiched without pressing on the touch panel 10, and in this case, the touch panel 10 continuously assumes a condition in which the foreign material 100 is not detected. In particular, in the event of fine or minute foreign material 100, it is difficult to discover such foreign material by visual inspection, and therefore, the user carries out a touch operation on the touch panel 10 using a finger 200 (see FIGS. 2B to 2D), a touch pen, or the like without noticing the presence of the foreign material 100.

Figure 2B:
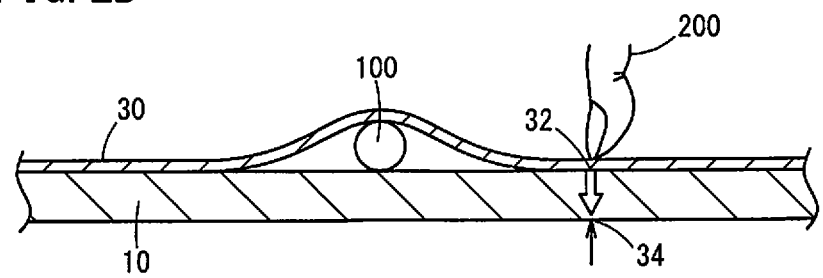
FIG. 2B is a first explanatory diagram for explaining detection of a touch panel in a state in which foreign material is caught therein.

At this time, as shown in FIG. 2B, when the touch operation is performed on the protective sheet 30 at a position separated away from the foreign material 100 to a certain extent, then the touch panel 10 correctly detects a normal touch position 32 which is not affected by the foreign material 100. More specifically, the touch panel 10 outputs to the numerical controller 14 an output signal in which the touch position 32 of the user and the detection position 34 coincide with each other on the two-dimensional coordinates of the touch panel 10.

Figure 2C:
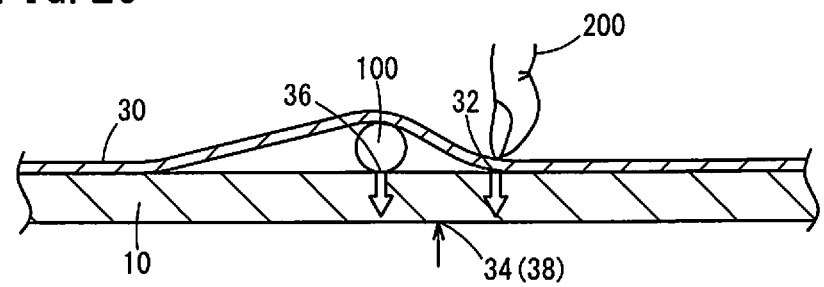
FIG. 2C is a second explanatory diagram for explaining detection of a touch panel in a state in which foreign material is caught therein.

However, when the touch operation (touch position 32) of the user comes into proximity to the foreign material 100, an erroneous detection is generated in the vicinity of the foreign material 100. For example, as shown in FIG. 2C, accompanying the touch operation of the user with respect to the protective sheet 30, the foreign material 100 presses on the touch panel 10 through the protective sheet 30. In this case, the transparent resistive film of the touch panel 10 produces reactions both at the touch position 32 and a pressing position 36 where the foreign material 100 presses on the touch panel 10, and the touch panel 10 outputs an intermediate position 38, which exists between the touch position 32 and the pressing position 36, as an output signal. More specifically, the detection position 34 of the touch panel 10 becomes deviated from the touch position 32 intended by the user in a direction toward the foreign material 100.

Figure 2D:
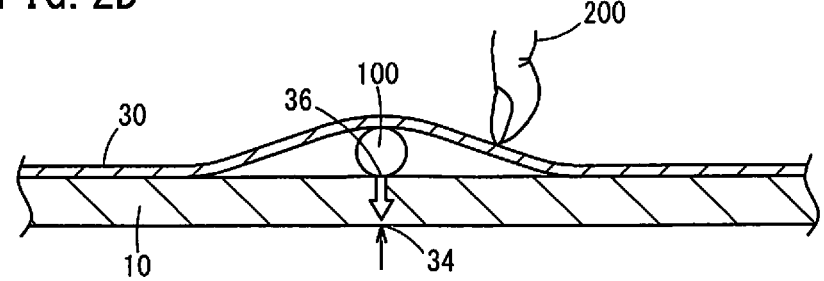
FIG. 2D is a third explanatory diagram for explaining detection of a touch panel in a state in which foreign material is caught therein.

Further, as shown in FIG. 2D, immediately prior to touching the protective sheet 30, immediately prior to separating away from the protective sheet 30, or in the case that the touch operation is weak, there is a possibility that, without detecting the touch position 32, the touch panel 10 will output only the pressing position 36 of the foreign material 100 as an output signal. More specifically, the numerical controller 14 detects the pressing position 36 as the detection position 34, and in this case, the detection position 34 is deviated significantly in the direction of the foreign material 100 from the touch position 32 intended by the user.

Whether it is the first state in which the intermediate position 38 between the touch position 32 and the pressing position 36 is detected as shown in FIG. 2C, or the second state in which the pressing position 36 is detected as in the example shown in FIG. 2D, depends on the shape or the like of the foreign material 100, and thus it is difficult for the numerical controller 14 to determine whether it is the first state or the second state. Further, depending on the touch operation, since the state may change from the first state to the second state, or from the second state to the first state, it is difficult for the numerical controller 14 to correctly determine the touch position 32.

Therefore, according to the present embodiment, the inspection device 12 implements an inspection mode by functioning under the operation of the user. In the inspection mode, a detection capability of the touch panel 10 is notified to the user by identifying a coincident or a deviated state between the touch position 32 of the user and the detection position 34 by the touch panel 10, and by displaying such a result on the display unit 11.

Figure 3:
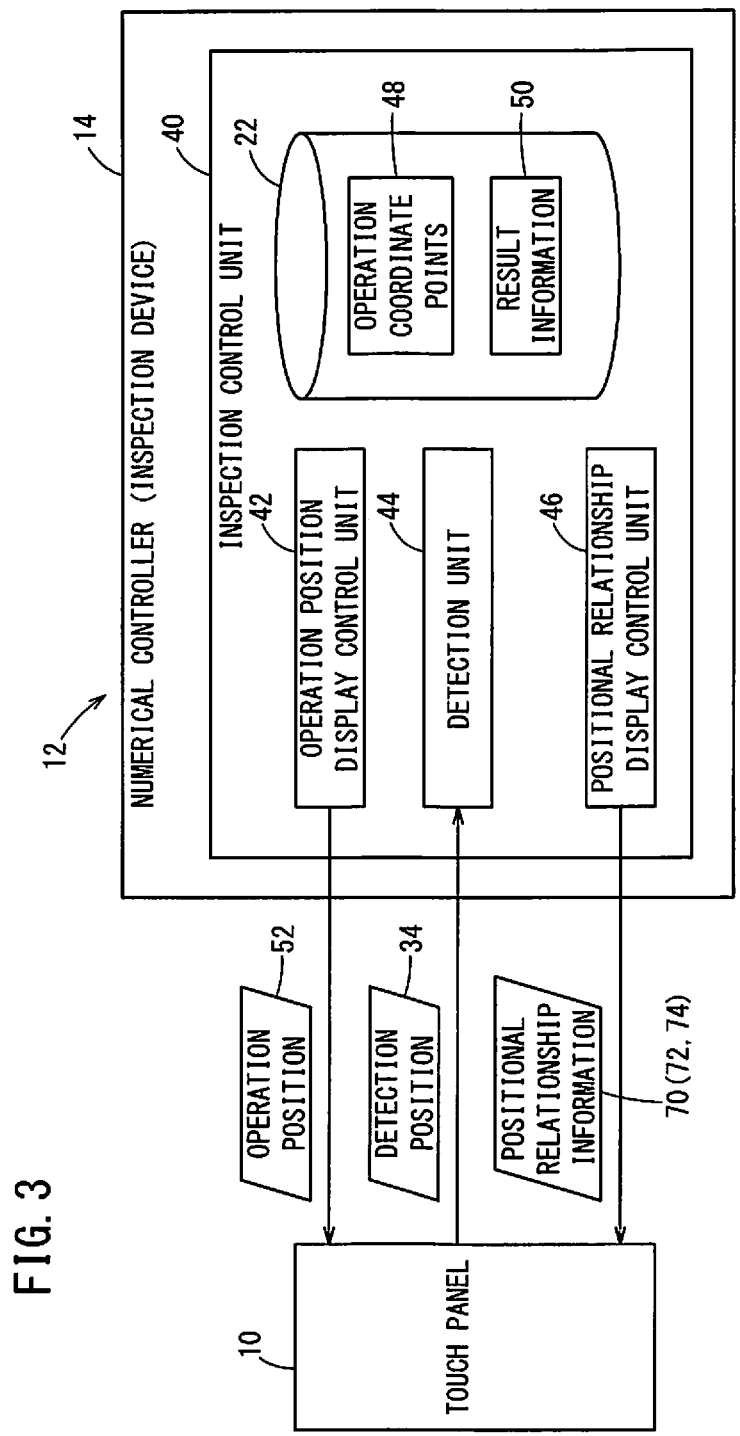
FIG. 3 is a functional block diagram showing the touch panel and the inspection device.

In implementing the inspection mode, the processor 20 of the inspection device 12 (numerical controller 14) executes a non-illustrated inspection program that is stored in the memory 22, whereby as shown in FIG. 3, an inspection control unit 40 is constructed internally in the inspection device 12. The inspection control unit 40 includes internally therein an operation position display control unit 42, a detection unit 44, and a positional relationship display control unit 46. Further, the inspection control unit 40 constructs an operation coordinate points storage area 48 and a result information storage area 50 inside the memory 22.

Figure 4A:
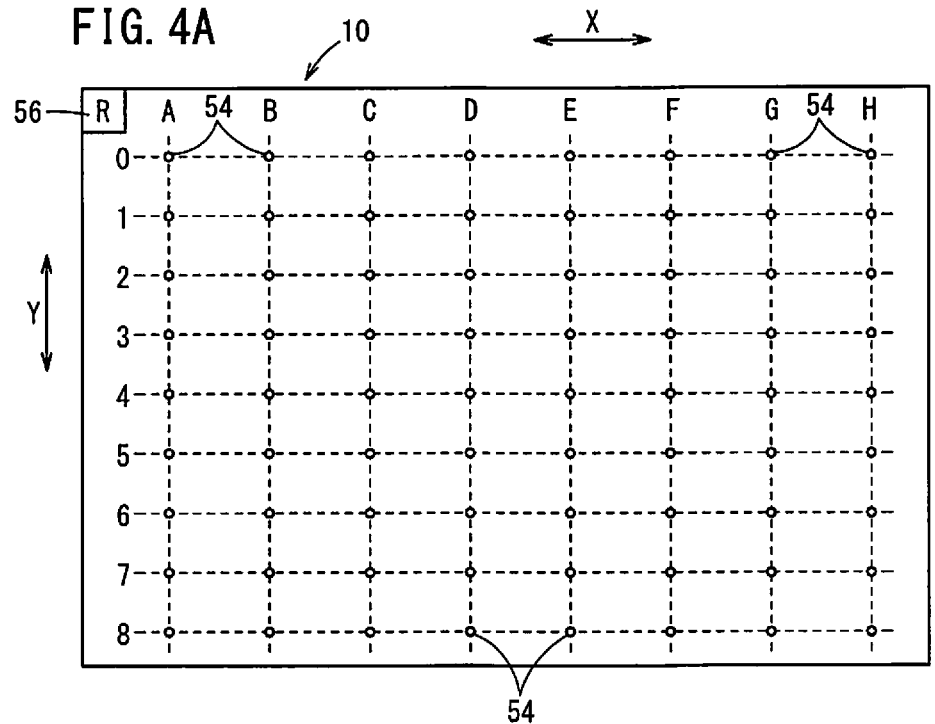
FIG. 4A is a plan view showing operation coordinate points of the touch panel.

Accompanying execution of the inspection mode, the operation position display control unit 42 displays on the touch panel 10 the operation position 52 which the user is prompted to touch. As shown in FIG. 4A, the operation position display control unit 42 reads out information on a plurality of operation coordinate points 54, which have been stored in advance in the operation coordinate points storage area 48 of the memory 22, and the operation position 52 is displayed in units of the plurality of operation coordinate points 54.

The plurality of operation coordinate points 54 are arranged in the form of a matrix distribution corresponding to the entire surface of the touch panel 10. More specifically, the operation coordinate points 54 are arranged at equal intervals along the X direction (horizontal direction) of the touch panel 10, and further, are arranged at equal intervals along the Y direction (vertical direction) of the touch panel 10. Hereinafter, in the case of specifying a particular operation coordinate point 54, according to the illustrated example, alphabetic letters (A to H) in the X direction, and numbers (0 to 8) in the Y direction are provided to denote the operation coordinate point 54 by a particular combination thereof.

In the operation coordinate points storage area 48, positions in the X direction and positions in the Y direction of the plurality of operation coordinate points 54 are stored as digitalized coordinate information (see also FIG. 6). Further, the operation coordinate points 54 are stored in association with display order information when the operation positions 52 are displayed. Moreover, in FIG. 4A, although a state is shown in which the operation coordinate points 54 are arranged in eight columns in the X direction and nine rows in the Y direction, it is a matter of course that the number of columns and rows may be designed arbitrarily in accordance with the shape of the touch panel 10. Further, in FIG. 4A, although dashed lines are illustrated between adjacent operation coordinate points 54, the dashed lines may be displayed along therewith when a plurality of operation coordinate points 54 (operation positions 52) are displayed, or the dashed lines may not be displayed. Alternatively, the plurality of operation coordinate points 54 may be arranged not only in the form of a matrix, but may also be arranged in an irregular manner, for example.

Figure 4B:
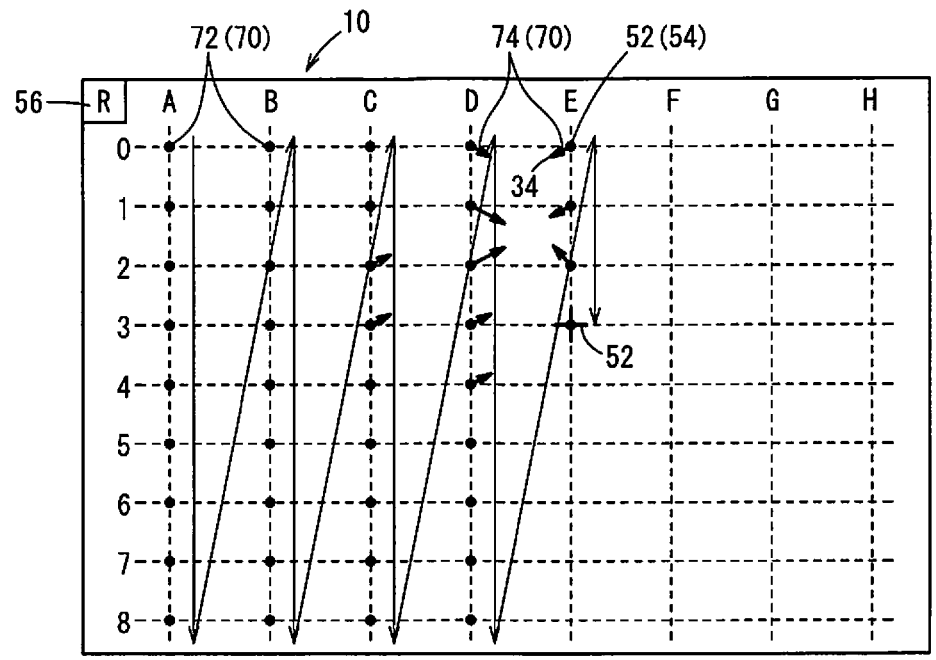
FIG. 4B is a plan view illustrating movement of an operation position of the touch panel, and positional relationship information.

As shown in FIG. 4B, the operation position display control unit 42 sequentially displays the operation positions 52 which the user is prompted to touch, on the operation coordinate points 54 which are arranged in the form of a matrix. In the present embodiment, a display image of the operation position 52 is in the form of a cross-shaped cursor, and it is possible to prompt the user to touch a center portion of the cursor. Of course, the form in which the operation position 52 is displayed may be set freely. Along with the display of the operation position 52, the operation position display control unit 42 may also display guidance information to prompt the user to perform a touch operation, on the touch panel 10.

Further, accompanying initiation of implementation of the inspection mode, the operation position display control unit 42 displays the operation position 52 at one corner portion in the matrix shape (at an upper left corner portion in FIG. 4B (at the operation coordinate point 54 of A0)). When a touch operation (detection position 34) of the user is detected with respect to the displayed operation position 52, the operation position 52 is moved by one (one row) in the Y direction, and is next displayed at the operation coordinate point 54 of A1. Thereafter, similar operations are repeated, so that when the touch operation on the corner portion (at the operation coordinate point 54 of A8) at the other end of the same column is completed, a move is made to one end of the adjacent column (at the operation coordinate point 54 of B0), whereupon the same operations are repeated. Consequently, the operation position 52 is displayed on all of the set operation coordinate points 54, and the user is made to perform touch operations thereon. Furthermore, during the inspection mode, the operation position display control unit 42 outputs information of the operation positions 52 being displayed to the detection unit 44.

Moreover, when the operation position 52 is displayed, the operation position display control unit 42 need not necessarily display the operation coordinate points 54 that are arranged in a form of a matrix, or conversely, may display the plurality of operation coordinate points 54 in the background. Alternatively, without displaying the operation position 52, the operation position display control unit 42 may display the plurality of operation coordinate points 54 on the touch panel 10, and in accordance with guidance information, the user may be prompted to sequentially touch the operation coordinate points 54.

Further, it is preferable that the operation position display control unit 42 displays a reset button 56 in order to enable the operations to be performed again when the user makes an erroneous touch operation. Resetting of the touch operation may be selectable between a process of returning the operation position 52 to the previous operation coordinate point 54 with respect to the currently displayed operation coordinate point 54, and a process of returning the operation position 52 to the beginning and doing the inspection mode over again.

The detection unit 44 of the inspection control unit 40 receives the output signals based on the actual touch operations (touch positions 32) of the user with respect to the operation positions 52 displayed by the operation position display control unit 42. The detection unit 44 recognizes the output signals as detection positions 34. Therefore, if foreign material 100 is not sandwiched between the touch panel 10 and the protective sheet 30, the detection positions 34 are detected at the same positions as the displayed operation positions 52. When foreign material 100 exists between the touch panel 10 and the protective sheet 30, there may be cases in which, as shown in FIG. 2B, the detection position 34 is detected at the same position as the operation position 52 without being influenced by the foreign material 100, as well as cases in which, as shown in FIGS. 2C and 2D, the detection position 34 is detected at a position that is deviated from the operation position 52.

Upon receiving the detection positions 34 from the touch panel 10, the detection unit 44 stores the detection positions 34 in the result information storage area 50 of the memory 22 as digitalized coordinate information of the X direction and the Y direction. Upon execution of the inspection mode, a results database 60 (see also FIG. 6) in which the result information is registered is automatically generated in the result information storage area 50, and the detection positions 34 are associated with the coordinate information of the operation positions 52 and stored in the results database 60.

Further, at a time of execution of the inspection mode, the date and time (time) measured by the timer unit 26 are extracted, and the date and time are associated with the results and stored in the results database 60. In addition, with each execution of the inspection mode, the inspection control unit 40 accumulates and stores the results database 60 in the result information storage area 50.

The positional relationship display control unit 46 of the inspection control unit 40 displays positional relationship information 70 indicative of the operation positions 52 and the detection positions 34 (result information) on the touch panel 10. The positional relationship information 70 is image information that enables the user to visually recognize the operation positions 52 and the detection positions 34 in a comparable manner. According to the present embodiment, in the case that the operation position 52 and the detection position 34 are coincident with each other, a point notation 72 is provided therefor, and in the case that the operation position 52 and the detection position 34 are non-coincident (do not match one another), an arrow notation 74 is provided in which the operation position 52 is set as the starting point and the detection position 34 is set as the end point of the arrow.

More specifically, accompanying detection of the detection positions 34 by the detection unit 44, the positional relationship display control unit 46 refers to the results database 60, and thereby determines whether the operation position 52 and the detection position 34 are coincident or non-coincident with each other. In addition, if it is determined that they are non-coincident with each other, the positional relationship display control unit 46 performs a process to generate the arrow notation 74 in which the operation position 52 and the detection position 34 are connected.

Consequently, based on displaying the operation positions 52 at the time of the inspection mode, when the touch operations of the user are completed, for example, a screen is displayed on the touch panel 10 as shown in FIG. 5. In FIG. 5, the arrow notations 74 extend into a range enclosed by the operation coordinate points 54 of D1, D2, E1, E2, and thus it can be estimated that foreign material 100 exists within this range. The range in which it is presumed that the foreign material 100 exists may have a predetermined color applied thereto, which is shown as hatching in the illustrated example. Thus, the user is capable of confirming the detection accuracy of the touch operations on the touch panel 10 by visually recognizing the arrow notations 74 and/or the predetermined color displayed on the touch panel 10.

A configuration may be provided in which the positional relationship information 70 is displayed each time one detection position 34 is detected, or a configuration may be provided in which the positional relationship information 70 is displayed collectively at a stage at which the user's touch operations with respect to all of the operation coordinate points 54 (operation positions 52) are completed. Moreover, the positional relationship information 70 is not particularly limited to being displayed in the form of arrow notations 74, and for example, may be displayed as simple line segment notations. Further, the positional relationship display control unit 46 may alter the displayed content of the positional relationship information 70 in accordance with the amount of deviation between the operation position 52 and the detection position 34. For example, a configuration can be provided in which the display color is changed depending on whether the amount of deviation is small or large.

Furthermore, a configuration may be provided in which the positional relationship display control unit 46 displays on the touch panel 10 past and present result information that is stored in the result information storage area 50. In this case, the positional relationship display control unit 46 can be configured to display simultaneously and in a distinguishable manner on the touch panel 10 the arrow notations 74 based on the past results database 60, and the arrow notations 74 based on the current results database 60. For example, the arrow notations 74 based on the past results database 60, and the arrow notations 74 based on the current results database 60 may be displayed in different colors.

Alternatively, a configuration may be provided in which the positional relationship display control unit 46 displays the arrow notations 74 based on the past results database 60, and the arrow notations 74 based on the current results database 60 in a time shifted manner. For example, a display may be made sequentially from the arrow notations 74 of an oldest results database 60 that is stored in the result information storage area 50, for each of the arrow notations 74 of an old results database 60, and finally, the arrow notations 74 of the current results database 60 may be displayed. In accordance with this feature, it is possible to recognize changes in the positional relationship between the operation positions 52 and the detection positions 34.

on device (12) fas shown in FIG. 6, the positional relationship display control unit 46 may be configured to provide a display in the form of a table on the touch panel 10, using the results database 60 stored in the result information storage area 50.

Next, operations of the inspection device 12 having the above-described configuration will be described with reference to the flowchart of FIG. 7.

At a time of normal operation, the numerical controller 14 controls operations of the machine tool 18 on the basis of operations performed by the user via the touch panel 10. In addition, the inspection device 12 implements the inspection mode in which inspection of the touch panel 10 is carried out under an instruction of the user at a time of periodic maintenance (for example, at intervals of one month) or when an erroneous detection of the touch panel 10 occurs.

When the inspection mode is started, the inspection control unit 40 automatically generates the results database 60 as an initial setting (step S1). The results database 60 is temporarily stored in a non-illustrated buffer of the inspection control unit 40.

The operation position display control unit 42 reads out information of the plurality of operation coordinate points 54 from the operation coordinate points storage area 48, and displays an operation position 52 on the touch panel 10 based on the starting point (the operation coordinate point 54 of A1) (step S2: operation position display step). Consequently, based on the displayed operation position 52, using his or her finger or a touch pen, the user performs a touch operation with respect to the touch panel 10. In other words, a position that is superimposed on the operation position 52 is appropriately pressed with the tip end of the finger or the touch pen.

Further, in the inspection mode, the detection unit 44 determines whether or not an output signal of the detection position 34 from the touch panel 10 has been received (step S3). In the case that an output signal of the detection position 34 has not been received (step S3: NO), step S3 is repeated and monitoring for the output signal is continued. On the other hand, upon receiving an output signal from the touch panel 10 (step S3: YES), the detection unit 44 detects such data as a detection position 34 (step S4: detection step), associates it with the operation position 52 received from the operation position display control unit 42, and records the associated information in the results database 60 of the buffer.

When detection of the detection position 34 is notified from the detection unit 44, the positional relationship display control unit 46 reads out the results database 60, and generates the point notation 72 or the arrow notation 74 (positional relationship information 70) from the operation position 52 and the detection position 34 (step S5). As discussed above, the arrow notation 74 includes the coordinate information of the operation position 52 and the coordinate information of the detection position 34 on the touch panel 10, and represents the state of deviation in the form of a vector.

By outputting an arrow notation 74 to the display unit 11, the positional relationship display control unit 46 displays on the touch panel 10 the arrow notation 74 in which the starting point overlaps with the operation position 52 (operation coordinate point 54) (step S6: positional relationship displaying step).

Further, when step S6 is completed, the inspection control unit 40 confirms at which position (display order information) the operation position 52 is located among the plurality of operation coordinate points 54, and determines whether or not touch operations have been completed at all of the operation coordinate points 54 (step S7). In step S7, in the case there is an operation coordinate point 54 for which a touch operation has not been made (step S7: NO), it is determined that the touch operations have not been completed, and the routine returns to step S2. Consequently, the inspection control unit 40 repeats the processes of steps S2 through S7. On the other hand, in step S7, in the case all of the touch operations have been made (step S7: YES), it is determined that the touch operations have been completed, and the routine proceeds to step S8.

Further, at a stage at which the touch operations are completed, all of the arrow notations 74 are displayed together with all of the operation coordinate points 54 on the touch panel 10. By observing the final state of the touch panel 10 as a whole, the user is capable of grasping an overall tendency of the deviations of the detection positions 34. In particular, since deviations of the detection positions 34 at a plurality of operation coordinate points 54 can be perceived visually in the form of vectors, it is possible to form an accurate hypothesis of a range within which an abnormality (the position of foreign material 100) occurs.

In addition, in step S8, a termination process of the inspection mode is implemented. For example, the inspection control unit 40 asks the user for confirmation of completion of the inspection, and eliminates the point notations 72 and the arrow notations 74 displayed on the touch panel 10. Further, the results database 60 that was temporarily stored in the buffer or the like is stored in the result information storage area 50 together with the dates and times measured by the timer unit 26. Consequently, the inspection device 12 transitions from inspection of the touch panel 10 to the normal control mode.

The present invention is not limited to the above-described embodiment, and various modifications may be adopted therein in accordance with the scope of the present invention. For example, the numerical controller 14 may utilize the information in the results database 60, and perform a process of correcting or compensating a touch position when the user performs a touch operation during operations other than in the inspection mode.

In this instance, when the user presses on the operation position 52, as shown in FIG. 2C, pressing forces act on both the foreign material 100 and the operation position 52, and a midpoint therebetween is detected as the detection position 34. However, only the pressing position 36 of the foreign material 100 may also be detected, as shown in FIG. 2D. In particular, during a short time interval immediately prior to the user's finger 200 separating away (being released) from the protective sheet 30, without any pressing force being applied to the operation position 52, a pressing force may still be applied only by the foreign material 100 (i.e., the pattern of FIG. 2D). Hereinafter, the detection position 34 for a case in which the detection position 34 undergoes a change when the finger 200 is released from the touch panel 10 (a transition takes place from the pattern of FIG. 2C to the pattern of FIG. 2D) will be referred to as a release time detection position 80. Moreover, in the case that foreign material 100 is not sandwiched therein (or if there is no influence from the foreign material 100), the detection position 34 and the release time detection position 80 coincide with each other.

As in the modification shown in FIG. 8A, the numerical controller 14 (inspection device 12) can be configured to detect the release time detection position 80 during the inspection mode, and to display the release time detection position 80 on the touch panel 10. For example, the detection unit 44 detects a detection position 34 during pressing in accordance with a touch operation of the user. The detection position 34 is an intermediate position 38 between the operation position 52 (touch position 32) and the pressing position 36 of the foreign material 100. In addition, the detection unit 44 detects the release time detection position 80 during a predetermined period at the time that the touch operation is released. The period during which the release time detection position 80 is detected may be set in advance, for example, to a duration of 0.1 seconds or less, and any values detected in excess of this period may be disregarded as the release time detection position 80. Consequently, it is possible to exclude a determination of the release time detection position 80 when the user newly performs the touch operation.

When the detection position 34 and the release time detection position 80 are respectively detected, the detection unit 44 associates them with the operation position 52, and stores the associated information in the results database 60.

In addition, on the basis of the operation positions 52 (operation coordinate points 54), the detection positions 34, and the release time detection positions 80 of the results database 60, the positional relationship display control unit 46 may display on the touch panel 10 the positional relationship information 70 as illustrated in FIG. 8A. More specifically, similar to the above-described embodiment, the first arrow notation 82 (first information) with the operation position 52 as a starting point and the detection position 34 as an end point is displayed for each of the operation coordinate points 54. Furthermore, in the case that the release time detection position 80 has changed, a second arrow notation 84 (second information) is added with the detection position 34 (or the operation position 52) as a starting point and the release time detection position 80 as an end point. The first arrow notation 82 and the second arrow notation 84 preferably are displayed with mutually different display formats, or alternatively, they may be displayed at different times. Moreover, in FIG. 8A, the first arrow notation 82 is indicated by a solid line, whereas the second arrow notation 84 is indicated by a dashed line.

Further, as in the modification shown in FIG. 8B, a configuration may be provided in which the numerical controller 14 (positional relationship display control unit 46) does not display the first arrow notation 82, but rather, displays the positional relationship information 70 (second arrow notation 84) indicating the positional relationship between the operation position 52 and the release time detection position 80.

Technical concepts which can be grasped from the above-described embodiment, as well as the modification and the other modification thereof, are described below.

The first aspect of the present invention is the inspection device (12) for the touch panel (10), which is configured to inspect the touch panel (10) that is provided on the display unit (11), and includes the operation position display control unit (42) configured to display on the display unit (11) an operation position (52) that is touched by a user, the detection unit (44) configured to detect a touch position (32) depending on a touch operation of the user based on an output signal of the touch panel (10), and the positional relationship display control unit (46) configured to display on the display unit (11) positional relationship information (70) indicating a positional relationship between the operation position (52) and a detection position (34) based on the touch position (32) detected by the detection unit (44).

In accordance with the above-described configuration, in the inspection device (12), it is possible to easily inspect the detection position (34) of the touch panel (10), and to provide information to the user concerning a deviation of the detection position (34), thereby making it possible to recognize an abnormal state due to foreign material (100). More specifically, based on the displayed positional relationship information (70), the user becomes capable of suitably grasping a coincidence or non-coincidence between the touch position (32) based on the operation position (52), and the detection position (34) detected by the touch panel (10). Consequently, the user can appropriately determine whether to continue using the touch panel (10) or the protective sheet (30) covering the touch panel, or to seek repair or replacement thereof.

The operation position display control unit (42) displays a plurality of operation positions (52) at different positions on the touch panel (10), and the positional relationship display control unit (46) displays the positional relationship information (70) for each of the operation positions (52). In accordance with this feature, the inspection device (12) can provide the user with a distribution of the deviated state of the detection position (34). Thus, the user can take a view of changes in the plurality of detection positions (34) due to the foreign material (100).

In the case that the detection position (34) detected by the detection unit (44) has changed, the positional relationship display control unit (46) displays, as the positional relationship information (70), information (84) indicating a positional relationship between the operation position (52) and the detection position (80) after the change. More specifically, this configuration is the same as that described in the other modification. In accordance with this feature, display of the positional relationship information (70) on the touch panel (10) becomes simpler, and further, since the detection position (80) after the change indicates the presence of foreign material (100), the user easily recognizes the foreign material (100).

In the case that the detection position (34) detected by the detection unit (44) has changed, the positional relationship display control unit (46) displays, as the positional relationship information (70), first information (82) indicating a positional relationship between the operation position (52) and the detection position (34) before the change, and second information (84) indicating a positional relationship between the operation position (52) and the detection position (80) after the change. More specifically, this configuration is the same as that described in the modification. In accordance with this feature, the inspection device (12) can inform the user of a change in the deviated state of the detection position (34) due to foreign material (100), and enables the user to suitably recognize the position of the foreign material (100).

The positional relationship display control unit (46) causes the display formats of the first information (82) and the second information (84) to be different from each other. Consequently, by recognizing the first information (82) and the second information (84), the user is able to easily recognize the change in the detection positions (34, 80).

The inspection device (12) further includes the storage unit (22) configured to store result information (60) in which the operation position (52) is associated with the detection position (34). Consequently, it is possible to output various information to the user by utilizing the result information (60).

The storage unit (22) stores a time of the inspection in association with the result information. Consequently, the inspection device (12) is capable of comparing result information (60) of an inspection performed in the past, and result information (60) of an inspection performed at the present time.

The positional relationship display control unit (46) displays simultaneously and in a distinguishable manner the positional relationship information (70) based on past result information (60) stored in the storage unit (22), and the positional relationship information (70) based on the current result information (60). In accordance with this feature, the user can easily compare past and present detection positions (34).

The positional relationship display control unit (46) displays, in order of time and continuously, the positional relationship information (70) based on past result information (60) stored in the storage unit (22), and the positional relationship information (70) based on current result information (60). As a result, the user is able to recognize a transition of the past and present detection positions (34).

The positional relationship information (70) is an arrow notation with the operation position (52) as a starting point and the detection position (34) as an end point. In accordance with this feature, the inspection device (12) can allow the user to easily recognize the deviated state of the detection position (34) in the form of a vector.

The operation position display control unit (42) sets in advance for the touch panel (10) a plurality of operation coordinate points (54) in the form of a matrix, and displays the operation position (52) in units of the operation coordinate points (54). In accordance with this feature, the inspection device (12) enables the touch operation to be implemented evenly over the touch panel (10), and thereby the user is able to easily recognize a distribution of the deviated state.

Further, the second aspect of the present invention is the touch panel inspection method for inspecting the touch panel (10) that is provided on the display unit (11), including the operation position display step of displaying on the display unit (11) the operation position (52) that is touched by the user, the detection step of detecting the touch position (32) depending on the touch operation of the user based on an output signal of the touch panel (10), and the positional relationship displaying step of displaying on the display unit (11) the positional relationship information (70) indicating the positional relationship between the operation position (52) and the detection position (34) based on the touch position (32) detected in the detection step.

In accordance with this feature, in the inspection method for the touch panel (10), it is possible to easily inspect the detection position (34) of the touch panel (10), and to provide information to the user concerning a deviation of the detection position (34), thereby making it possible for the user to recognize an abnormal state due to foreign material (100).

What is claimed is:

1. A touch panel inspection device configured to inspect a touch panel that is provided on a display unit, comprising:
    an operation position display control unit configured to display on the display unit an operation position that is touched by a user;
    a detection unit configured to detect a touch position depending on a touch operation of the user based on an output signal of the touch panel; and a positional relationship display control unit configured to determine, based on the touch position detected by the detection unit, whether the operation position and a detection position are coincident or non-coincident with each other and to display, on the display unit, positional relationship information indicating a positional relationship between the operation position and the detection position when the operation position and the detection position are non-coincident with each other,
    wherein, in a case that the detection position detected by the detection unit has changed, the positional relationship display control unit displays, as the positional relationship information, information indicating a positional relationship between the operation position and the detection position after the change,
    wherein, the touch panel inspection device is further configured to:
    compare the detected touch position with the operation position;
    determine whether the touch panel is contaminated with a foreign material based on the comparison of the detected touch position and the operation position; and
    display a location of a position of the foreign material within the touch panel.

2. The touch panel inspection device according to claim 1, wherein:
    the operation position display control unit displays a plurality of operation positions at different positions on the touch panel; and
    the positional relationship display control unit displays the positional relationship information for each of the operation positions.

3. The touch panel inspection device according to claim 1, further comprising a storage unit configured to store result information in which the operation position is associated with the detection position.

4. The touch panel inspection device according to claim 3, wherein the storage unit stores a time of the inspection in association with the result information.

5. The touch panel inspection device according to claim 4, wherein the positional relationship display control unit displays simultaneously and in a distinguishable manner the positional relationship information based on past result information stored in the storage unit, and the positional relationship information based on current result information.

6. The touch panel inspection device according to claim 4, wherein the positional relationship display control unit displays, in order of time and continuously, the positional relationship information based on past result information stored in the storage unit, and the positional relationship information based on current result information.

7. The touch panel inspection device according to claim 1, wherein the positional relationship information is an arrow notation with the operation position as a starting point and the detection position as an end point.

8. The touch panel inspection device according to claim 1, wherein the operation position display control unit sets in advance for the touch panel a plurality of operation coordinate points in a form of a matrix, and displays the operation position in units of the operation coordinate points.

9. A touch panel inspection device configured to inspect a touch panel that is provided on a display unit, comprising:

an operation position display control unit configured to display on the display unit an operation position that is touched by a user;
a detection unit configured to detect a touch position depending on a touch operation of the user based on an output signal of the touch panel; and
a positional relationship display control unit configured to determine, based on the touch position detected by the detection unit, whether the operation position and a detection position are coincident or non-coincident with each other and to display, on the display unit, positional relationship information indicating a positional relationship between the operation position and the detection position when the operation position and the detection position are non-coincident with each other,
wherein, in a case that the detection position detected by the detection unit has changed, the positional relationship display control unit displays, as the positional relationship information, first information indicating a positional relationship between the operation position and the detection position before the change, and second information indicating a positional relationship between the operation position and the detection position after the change,
wherein, the touch panel inspection device is further configured to:
compare the detected touch position with the operation position;
determine whether the touch panel is contaminated with a foreign material based on the comparison of the detected touch position and the operation position; and
display a location of a position of the foreign material within the touch panel.

10. The touch panel inspection device according to claim 9, wherein the positional relationship display control unit causes display formats of the first information and the second information to be different from each other.

11. The touch panel inspection device according to claim 9, wherein:
the operation position display control unit displays a plurality of operation positions at different positions on the touch panel; and
the positional relationship display control unit displays the positional relationship information for each of the operation positions.

12. The touch panel inspection device according to claim 4, further comprising a storage unit configured to store result information in which the operation position is associated with the detection position.

13. The touch panel inspection device according to claim 12, wherein the storage unit stores a time of the inspection in association with the result information.

14. The touch panel inspection device according to claim 13, wherein the positional relationship display control unit displays simultaneously and in a distinguishable manner the positional relationship information based on past result information stored in the storage unit, and the positional relationship information based on current result information.

15. The touch panel inspection device according to claim 13, wherein the positional relationship display control unit displays, in order of time and continuously, the positional relationship information based on past result information stored in the storage unit, and the positional relationship information based on current result information.

16. The touch panel inspection device according to claim 9, wherein the positional relationship information is an arrow notation with the operation position as a starting point and the detection position as an end point.

17. The touch panel inspection device according to claim 9, wherein the operation position display control unit sets in advance for the touch panel a plurality of operation coordinate points in a form of a matrix, and displays the operation position in units of the operation coordinate points.

18. A touch panel inspection method for inspecting a touch panel that is provided on a display unit, comprising:
an operation position display step of displaying on the display unit an operation position that is touched by a user;
a detection step of detecting a touch position depending on a touch operation of the user based on an output signal of the touch panel; and
a positional relationship displaying step of determining, based on the touch position detected in the detection step, whether the operation position and a detection position are coincident or non-coincident with each other and of displaying, on the display unit, positional relationship information indicating a positional relationship between the operation position and the detection position are non-coincident with each other,
comparing the detected touch position with the operation position;
determining whether the touch panel is contaminated with a foreign material based on the comparison of the detected touch position and the operation position; and
displaying a location of a position of the foreign material within the touch panel,
wherein, in the positional relationship displaying step, in a case that the detection position detected in the detection step has changed, information indicating a positional relationship between the operation position and the detection position after the change is displayed as the positional relationship information.

19. A touch panel inspection method for inspecting a touch panel that is provided on a display unit, comprising:
an operation position display step of displaying on the display unit an operation position that is touched by a user;
a detection step of detecting a touch position depending on a touch operation of the user based on an output signal of the touch panel; and
a positional relationship displaying step of determining, based on the touch position detected in the detection step, whether the operation position and a detection position are coincident or non-coincident with each other and of displaying, on the display unit, positional relationship information indicating a positional relationship between the operation position and the detection position when the operation position and the detection position are non-coincident with each other,
comparing the detected touch position with the operation position;
determining whether the touch panel is contaminated with a foreign material based on the comparison of the detected touch position and the operation position; and
displaying a location of a position of the foreign material within the touch panel,
wherein, in the positional relationship displaying step, in a case that the detection position detected in the detection step has changed, first information indicating a positional relationship between the operation position and the detection position before the change, and second information indicating a positional relationship between the operation position and the detection position after the change are displayed as the positional relationship information.

\* \* \* \* \*